United States Patent
Lehmann

(10) Patent No.: US 6,798,272 B2
(45) Date of Patent: Sep. 28, 2004

(54) SHIFT REGISTER FOR SEQUENTIAL FUSE LATCH OPERATION

(75) Inventor: Gunther Lehmann, Poughkeepsie, NY (US)

(73) Assignee: Infineon Technologies North America Corp., San Jose, CA (US)

(*) Notice: Subject to any disclaimer, the term of this patent is extended or adjusted under 35 U.S.C. 154(b) by 0 days.

(21) Appl. No.: 10/187,868

(22) Filed: Jul. 2, 2002

(65) Prior Publication Data

US 2004/0004510 A1 Jan. 8, 2004

(51) Int. Cl.$^7$ ............................................... H01H 37/76
(52) U.S. Cl. ..................................... 327/525; 365/225.7
(58) Field of Search ............................... 327/525, 197, 327/198, 40, 407, 408, 427, 403, 404; 326/39, 40; 365/96, 103, 104, 200, 201, 204, 205, 225.7

(56) References Cited

U.S. PATENT DOCUMENTS

| | | | | |
|---|---|---|---|---|
| 5,038,368 A | * | 8/1991 | Lee | .............................. 377/28 |
| 5,402,390 A | * | 3/1995 | Ho et al. | .................. 365/225.7 |
| 5,668,818 A | * | 9/1997 | Bennett et al. | ............. 714/726 |
| 5,749,871 A | * | 5/1998 | Hood et al. | ................... 606/50 |
| 5,859,801 A | * | 1/1999 | Poechmueller | .............. 365/200 |
| 6,215,351 B1 | | 4/2001 | Le et al. | ..................... 327/525 |
| 6,307,794 B1 | * | 10/2001 | Haga | .......................... 365/200 |
| 6,426,911 B1 | * | 7/2002 | Bennett et al. | .......... 365/225.7 |

FOREIGN PATENT DOCUMENTS

EP          0 867 810 A2     9/1998     ........... G06F/11/20

* cited by examiner

Primary Examiner—Timothy P. Callahan
Assistant Examiner—Hai L. Nguyen

(57) ABSTRACT

A sequential fuse latch device comprises a plurality of fuse latches, wherein each fuse latch is a data storage element, and a shift register comprising a plurality of pointer latches, wherein each pointer latch is connected to at least one fuse latch, wherein the shift register controls a sequential operation of the plurality of fuse latches.

36 Claims, 7 Drawing Sheets

SHIFT REGISTER FOR SEQUENTIAL FUSE LATCH OPERATION

BACKGROUND OF THE INVENTION

1. Field of the Invention

The present invention relates to semiconductor fuses, and more particularly to, a shift register for sequential fuse latch operation.

2. Discussion of Related Art

Semiconductor circuits, like processors, microcontrollers, or memories, use fuse elements that allow chips to be configured individually. Parameters such as internal timings, supply voltage level, chip identification number and repair information can be adjusted on a per chip basis. For example, repair information can be used in memory circuits like DRAMs to control the way spare elements are used to repair defects. A typical 64 Mb DAM circuit comprises thousands of fuse elements. As the memory capacity of these semiconductor circuits increase, the number of fuses also increases.

The fuses can be evaluated by a fuse latch circuit, which translates an analog resistance value of a fuse link into a digital value ("high" or "low"). In addition, the fuse latch stores the digital value. FIG. 1 shows a fuse latch 100 in the lower right corner. For fuse evaluation, the signal 101 is brought low to turn on the PFET 103. This precharge operation causes the internal node 114 to go high. Even after the PFET is turned off again, the latch will keep the high value through the feedback loop (inverter 106).

A precharge operation is needed to initialize the fuse latch ahead of the actual fuse evaluation. The fuse evaluation can be started by bringing the read signal 102 high to turn on the NFET 104. The PFET of the feedback inverter 106 will sink a current through the fuse 105. If the fuse resistance is low, the voltage of the internal node 114 will drop and cause the latch to flip into the opposite state. In the case of a high fuse resistance however, the voltage drop will be small and the latch will not switch its state.

The precharge operation and the read operation cause a current flow. During the precharge operation, current flows from the positive voltage supply 109 through the PFET 103 and the NFET of the feedback inverter 106 to the ground voltage supply 108. The current flow stops after the fuse latch is tripped to the high state of node 114, which turns off the NFET of the feedback inverter 106.

During the read operation, a current flows from the positive power supply through the PFET of the feedback inverter 106, the NFET 104 and the fuse element 105 into the ground power supply 108. If the fuse resistance is low, the latch will trip to the low state of the internal node 114 and the current flow ceases. However, if the fuse resistance is high, the latch can remain in the high state and a constant current can be drawn from the power supply through the path outlined above.

As explained earlier, a single semiconductor chip can comprise several thousand fuse elements and the corresponding fuse latches. To minimize circuit area, those fuse latches typically share control signals (101, 102) and power supply lines (108, 109). Thus, the latches are operated simultaneously. The upper half of FIG. 1 shows a typical configuration of parallel connected fuse latches, the cumulative current of all latches is drawn from the power supply lines. The power supply connections exhibit an internal resistance 112 and 113, which results from the resistance of metal wires, contacts holes, bonding pads, etc. Therefore, a voltage drop occurs across the power supply lines, leading to a reduced positive supply voltage and an increased ground supply voltage whenever the fuse latches draw a current. If the number of fuse latches connected in parallel is high, the voltage drop can be so large that the precharge operation or the read operation is not executed correctly. This can lead to a misreading of the fuse value, which in turn can cause the malfunction of the chip.

Therefore, a need exists for a system and method for a shift register for sequential fuse latch operation.

SUMMARY OF THE INVENTION

According to an embodiment of the present invention, a sequential fuse latch device is provided. The sequential fuse latch device (hereinafter "device") comprises fuse latches, each fuse latch comprising a data storage element and a fusible link. The device further comprises a shift register comprising pointer latches, wherein each pointer latch is connected to at least one fuse latch, wherein the shift register controls a sequential operation of the plurality of fuse latches.

The operation is a read operation of the fuse latches. The operation is a precharge operation of the fuse latches. The operation is a precharge operation of a first fuse latch and a read operation of a second fuse latch.

Each pointer latch comprises an initialization circuit. The initialization circuit presets a state of the pointer latch.

Each pointer latch controls one of a fuse read operation, a fuse latch precharge operation, and a fuse read operation and a fuse latch precharge operation.

A fuse corresponding to a fuse latch is programmable, and wherein each pointer latch controls a programming operation according to an evaluation of the fuse latch.

Each fuse latch is connected to two corresponding pointer latches, wherein each pointer latch comprises a precharge control signal connected to a first fuse latch and a read operation control signal connected to a second fuse latch.

The device comprises an initialization signal connection to each pointer latch.

The device further comprises a common power supply connected to each fuse, a clock signal connected to each pointer latch, and a shift signals connected in series between each pointer latch.

The pointer latches propagate a value of an initialized pointer latch through the shift register in response to a clock signal.

According to an embodiment of the present invention, a sequential fuse latch device comprises an array of fuse latches, wherein each fuse latch is a data storage element, and a shift register comprising operation inputs to the array of fuse latches, wherein the shift register controls a sequential operation of the fuse latches.

The operation is a read operation of the fuse latches. The operation is a precharge operation of the fuse latches. The operation is a precharge operation of a first fuse latch and a read operation of a second fuse latch.

Each fuse latch device comprises a first transistor connected to a precharge signal and a power supply, a latch connected to a data signal, comprising a second transistor and connected to the first transistor, wherein the first and second transistors precharge the latch, and a third transistor connecting the data signal to a fuse, wherein a read signal and a fuse power up signal control the third transistor and a read operation of the fuse. The device further comprises a fourth transistor connecting the data signal to a power supply. The device comprises transfer gates connected to the data signal, wherein each transfer gate connected to a clock signal, and a second latch, wherein an adjacent sequential fuse latch device is connected to a data shift output of the second latch.

According to an embodiment of the present invention, a method is provided for sequential fuse operation. The method comprises initializing a first pointer latch to a first voltage, initializing a plurality of second pointer latches to a second voltage, and precharging a plurality of fuse latches connected to the plurality of second pointer latches. The method further comprises propagating an initial value of the first pointer latch through each of the plurality of second pointer latches, and activating an operation of each fuse latch as the initial value is propagated.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

Figure 1:
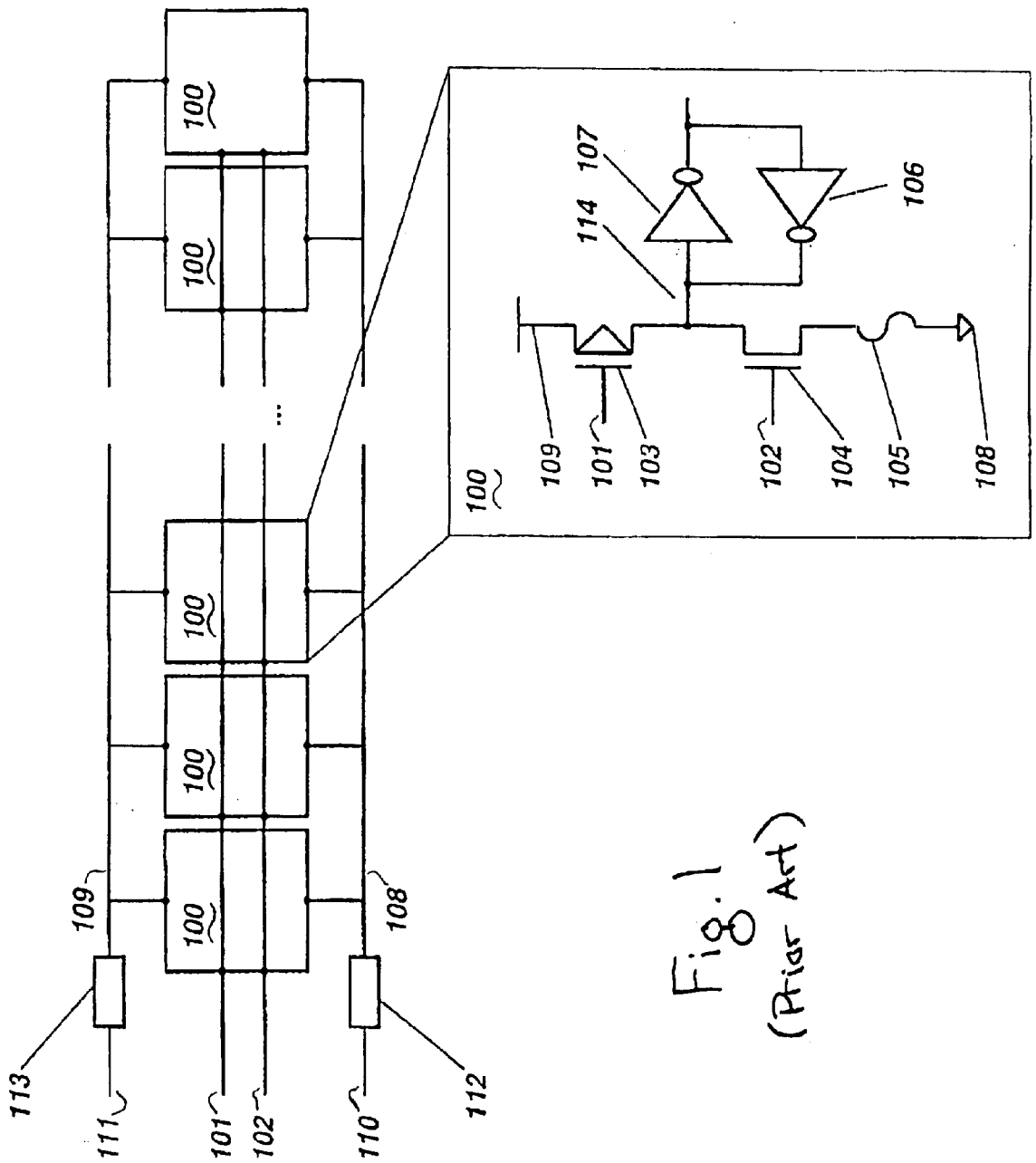
FIG. 1 is a diagram of an array of fuse latches.
Figure 2:
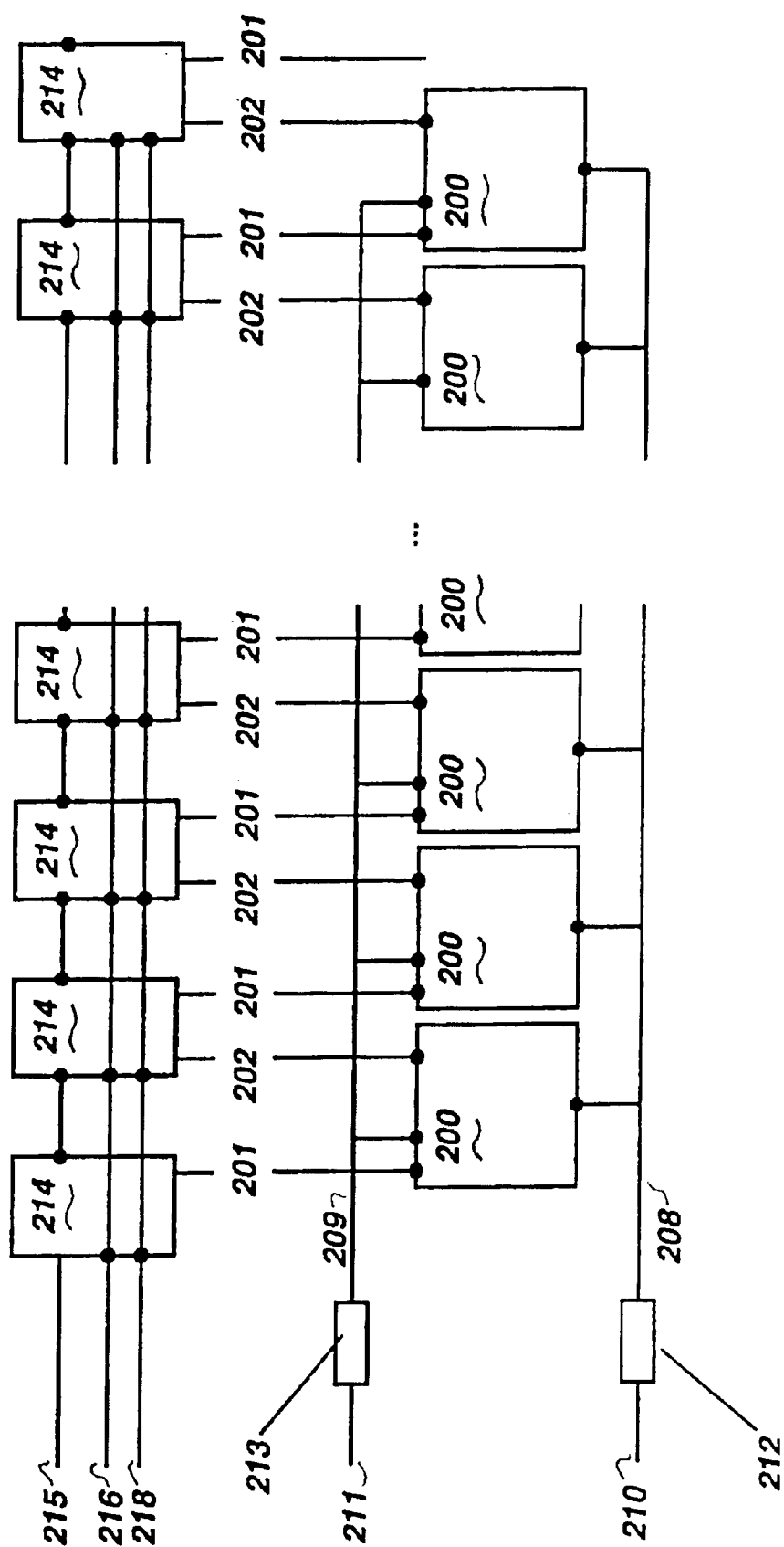
FIG. 2 is a diagram of an array of fuse latches and pointer latches according to an embodiment of the present invention.

According to an embodiment of the present invention, FIG. 2 illustrates a top-level block diagram wherein a number of fuse latches 200 are connected to the common power supply lines 208 and 209. The power supply connections, 210 and 211, exhibit an internal resistance 212 and 213. Each fuse latch 200 has a separate input signal 201, which controls the precharge operation and an input signal 202, which controls the read operation. The signals 201 and 202 are not shared between all fuse latches but instead are generated by another group of latches 214. For each fuse latch 200, a second latch 214 exists. In the configuration shown in FIG. 2, a fuse latch receives the read signal 202 from one of the latches 214 and the precharge signal 201 from another latch 214. The latches 214 share a common clock signal 216 and a common initialize signal 218. Furthermore, they are connected together by signals 215 to create a shift register. The latches 214, hereinafter referred to as pointer latches, store a signal value indicative of which fuse latch has to be precharged or read.

Figure 3:
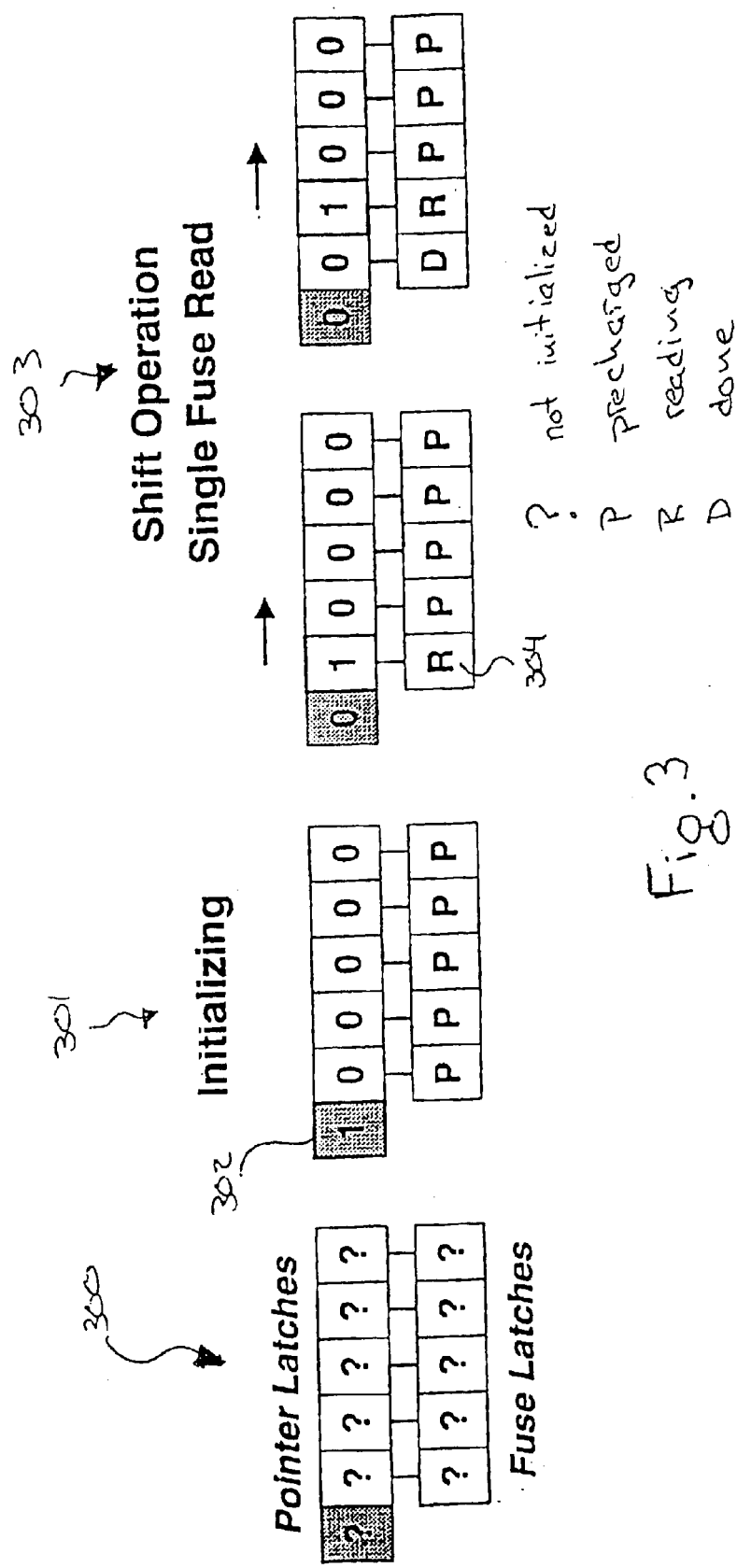
FIG. 3 is an illustration of an implementation of shift register according to an embodiment of the present invention.

FIG. 3 describes an operation mode of FIG. 2. Here, one fuse is read at a time. Before the latches are initialized 300, the state of the latches is unknown. During an initialize operation 301, the fuse latches are precharged simultaneously to a high or a low state. Here, a shared mutual signal 201 is assumed. Furthermore, the pointer latches are initialized to one state (here to "0"), except for the first latch of the shift register 302, which is initialized to the opposite state (here a "1"). Then the clock signal 216 of the pointer latches is operated, which propagates the initial value of the first pointer latch through the shift register 303. This initial value activates the read operation, e.g., 304, of a fuse latch via signal 202. By shifting a pointer signal value, one fuse is read at a time. Therefore, the current drawn from the power supply is minimal. Misreadings of the fuse latches caused by voltage drops across the power supply lines can be avoided. A safe fuse reading is enabled which ensures correct functionality of the semiconductor circuit.

Figure 4:
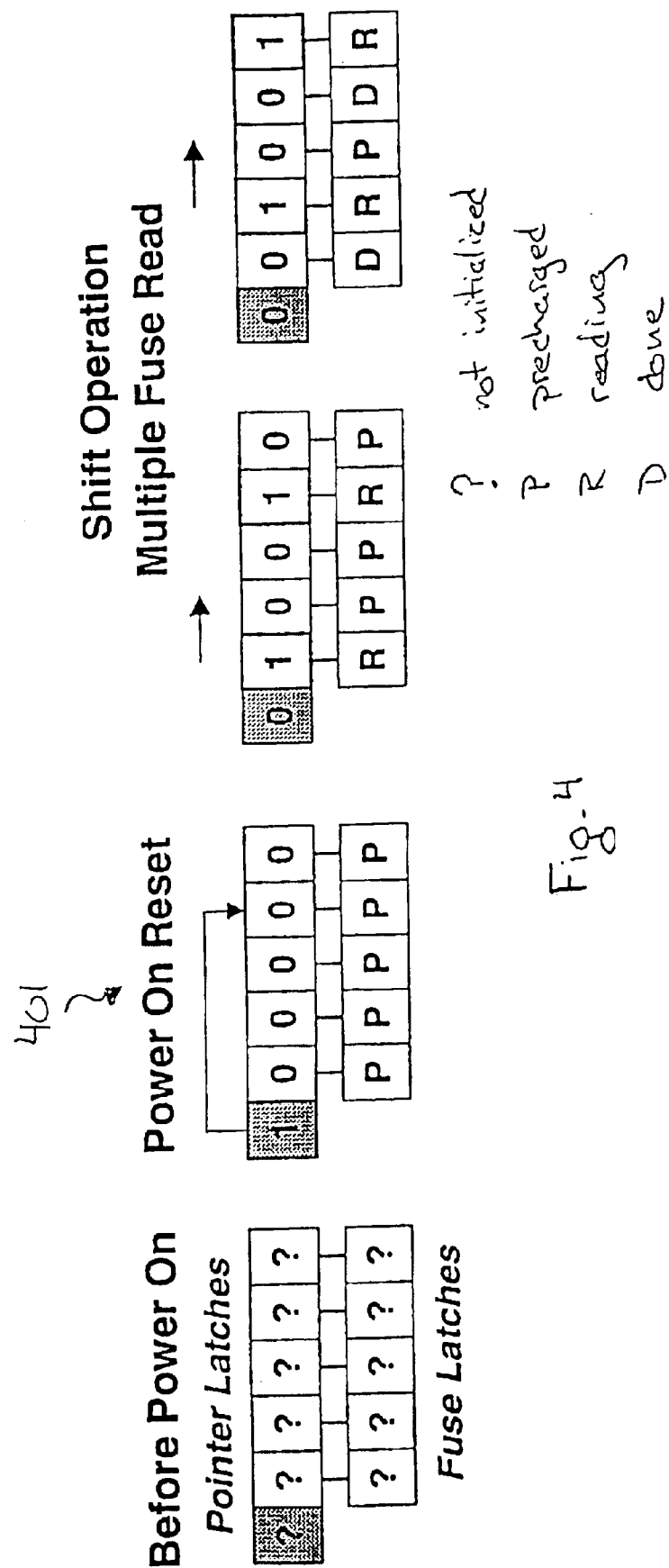
FIG. 4 is an illustration of an implementation of shift register according to an embodiment of the present invention.

FIG. 4 shows an additional operation mode of this invention. Here, multiple fuses are read simultaneously. During the initialize operation 401, more than one pointer latch is preset to a value that enables the read operation. Therefore, more than one pointer signal is propagated through the shift register. Each pointer signal enables a fuse read operation. Compared to the operation mode of FIG. 3, a smaller number of clock cycles (or shift operations) are needed to read all the fuses. For example, two pointer signals instead of one would cut the fuse read time in half. The initialize mode 401 can be made flexible so that the number of fuses being read in parallel can be adjusted to the parameters of the fuse element, the fuse latch and the power supply lines.

Figure 5:
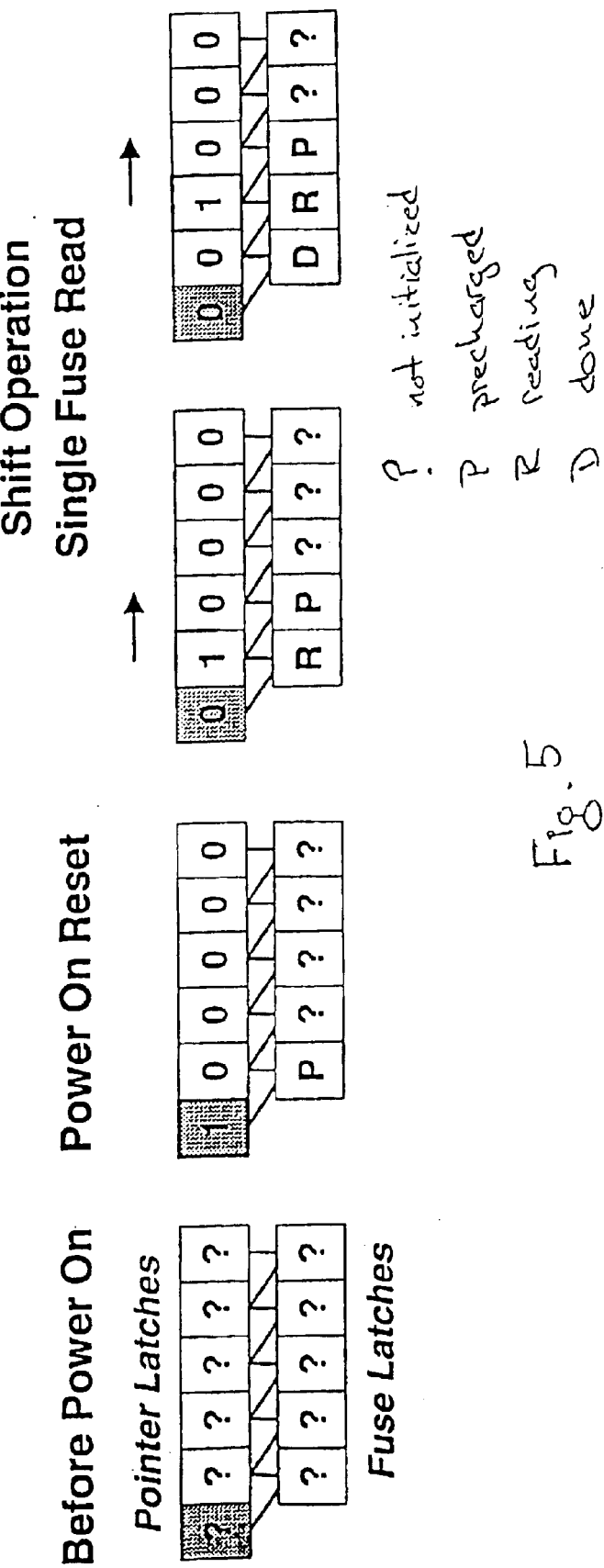
FIG. 5 is an illustration of an implementation of shift register according to an embodiment of the present invention.

Referring to FIG. 5, another embodiment of the present invention is illustrated showing that pointer latches can be used to control the read operation and the precharge operation. The fuse read operation needs a successful, preceding fuse latch precharge. The pointer signal, which is passed through the shift register, triggers the precharge operation of one fuse latch and the read operation of another fuse latch. This minimizes the current drawn during the precharge operation, since only one fuse latch is precharged at a time, in addition to the read operation of another fuse latch. Therefore, misreading caused by incorrect precharging can be avoided.

Figure 6:
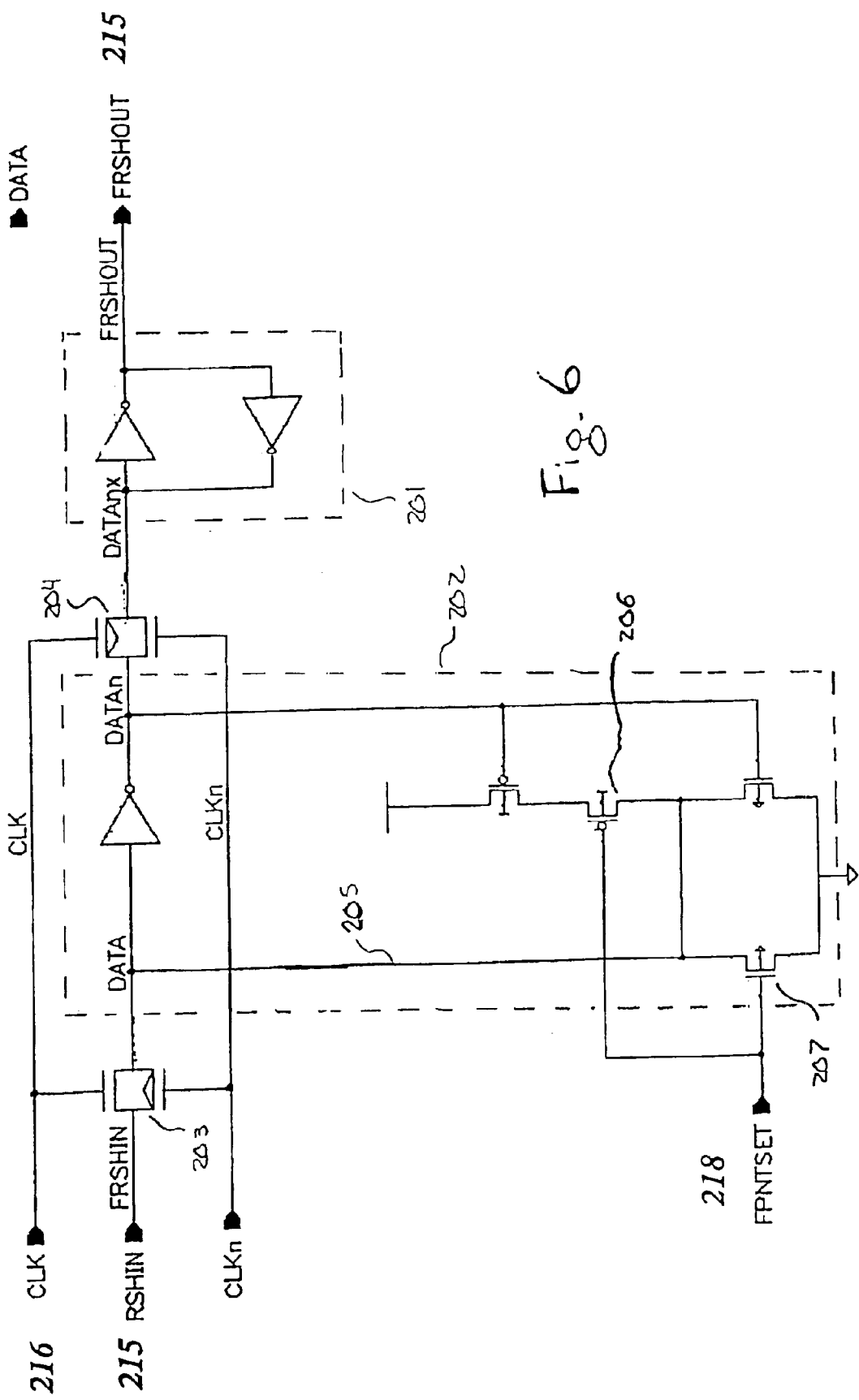
FIG. 6 is a circuit diagram of a pointer latch according to an embodiment of the present invention.

FIG. 6 illustrates an example of a pointer latch implementation according to an embodiment of the present invention. Two latch groups 201 and 202 and transmission gates 203 and 204 can be driven by each of the clock signal 216 CLK and its inverted value CLKn. The shift input signal 215 is shown as FRSHIN (fuse row shift in), the shift output signal 215 is shown as FRSHOUT (fuse row shift out). The signal DATA 205 is fed to the fuse latches as a precharge signal or a read signal. Transistors 206 and 207 initialize the pointer latch to a low state on the signal DATA. This initialization is enabled by bringing the input signal FPNT-SET (fuse pointer set) 218 high.

Figure 7:
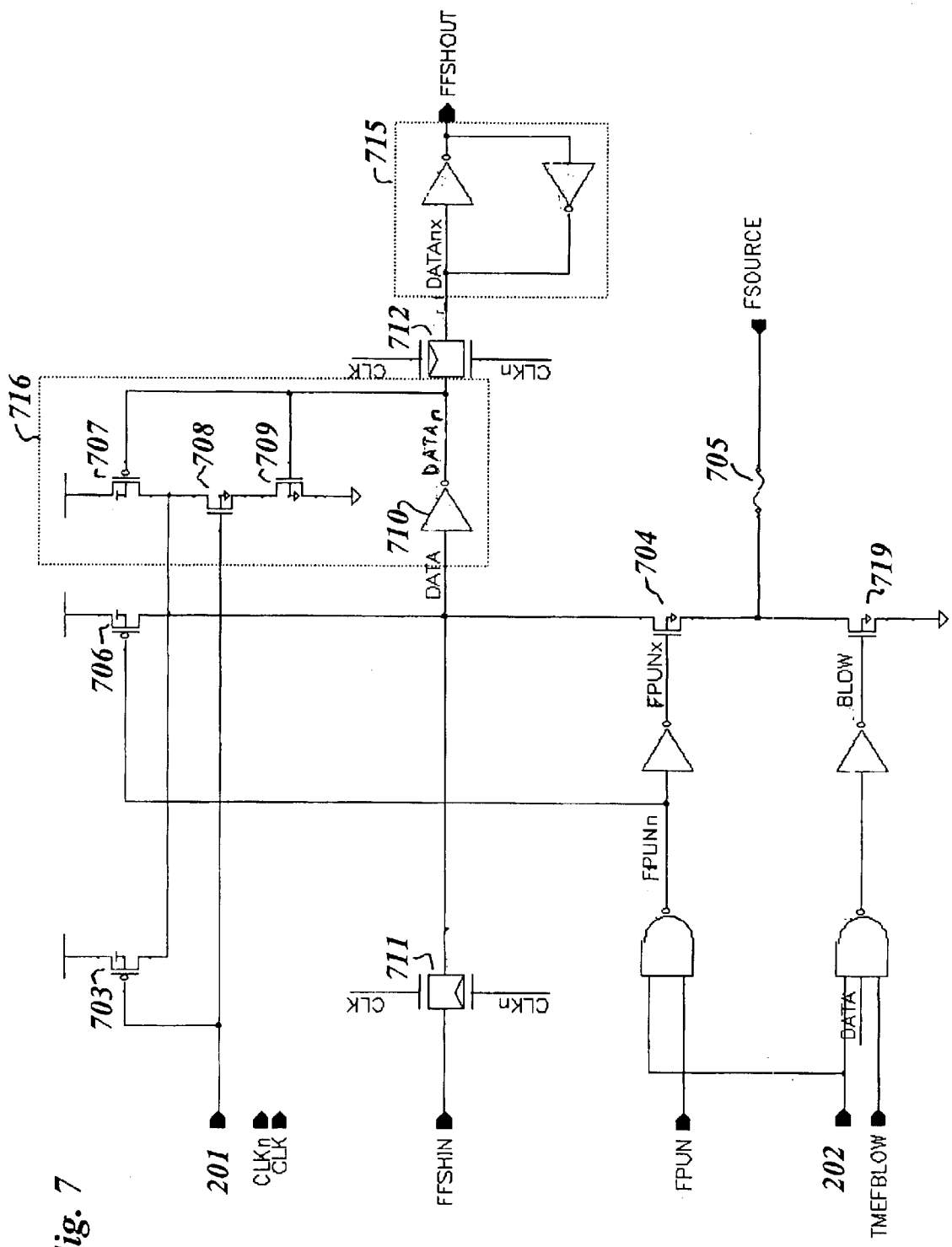
FIG. 7 is a circuit diagram of a fuse latch according to an embodiment of the present invention.

FIG. 7 shows a fuse latch where the fuse read signal 202 from the pointer latch controls the read transistor 704 and a FET 719, which can be used to program (e.g., blow) an electrical fuse 705. Latch 716 comprises transistors 707, 708, and 709 and the inverter 710. Transistors 703 and 708 can be used to precharge the latch 716. Signal 201 indicates a precharge operation, for example, by indicating "0", and can turn on the transistor 703, thus connecting the signal DATA to a power supply. Simultaneously, transistor 708 can be switched off. Consequently, the signal DATA of latch 716 assumes the precharge voltage, for example, the positive power supply. Transistor 704 connects the latch 716 to the fuse 705. With appropriate states of signals 202 and FPUN (fuse power up NFET), for example, both signals being "1", transistor 704 can be turned on, enabling the fuse read operation.

FIG. 7 also shows an input signal FFSHIN (fuse fuse shift in), an output signal FFSHOUT (fuse fuse shift out) and a signal used in test mode, TMEFBLOW (test mode e-fuse blow). The TMEFBLOW signal can be applied to the transistor 719 as a BLOW signal to blow the fuse 705.

In addition, a transistor 706 is shown connecting the signal DATA to a power supply, for example, the positive power supply, during the fuse read operation. Transfer gates 711 and 712 and a latch 715 are shown connected between FFSHIN and FFSHOUT such that a shift register can be built comprising fuse latches according to FIG. 7. Having described embodiments for shift register for sequential fuse latch operation, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A sequential fuse latch device comprising:
    a plurality of fuse latches, each fuse latch comprising a data storage element and a fusible link; and
    a shift register comprising a plurality of pointer latches, wherein each pointer latch is connected to at least one fuse latch, wherein the shift register controls a sequential operation of the plurality of fuse latches,
    wherein each fuse latch receives a separate precharge input signal, which controls a precharge operation, and a read input signal, which controls a read operation, and
    wherein the precharge input signal and the read input signal are generated by a corresponding pointer latch and control less than the plurality of fuse latches.

2. The sequential fuse latch device of claim 1, wherein the operation is a read operation of the fuse latches.

3. The sequential fuse latch device of claim 1, wherein the operation is a precharge operation of the fuse latches.

4. The sequential fuse latch device of claim 1, wherein the operation is a precharge operation of a first fuse latch and a read operation of a second fuse latch.

5. The sequential fuse latch device of claim 1, wherein each pointer latch comprises an initialization circuit.

6. The sequential fuse latch device of claim 5, wherein the initialization circuit presets a state of the pointer latch.

7. The sequential fuse latch device of claim 1, wherein each pointer latch controls one of a fuse read operation, a fuse latch precharge operation, and a fuse read operation and a fuse latch precharge operation.

8. The sequential fuse latch device of claim 1, wherein a fuse corresponding to a fuse latch is programmable, and wherein each pointer latch controls a programming operation according to an evaluation of the fuse latch.

9. The sequential fuse latch device of claim 1, wherein each fuse latch is connected to two corresponding pointer latches, wherein each pointer latch comprises a precharge control signal connected to a first fuse latch and a read operation control signal connected to a second fuse latch.

10. The sequential fuse latch device of claim 1, further comprising an initialization signal connection to each pointer latch.

11. The sequential fuse latch device of claim 1, further comprising:
    a common power supply connected to each fuse;
    a clock signal connected to each pointer latch; and
    a shift signals connected in series between each pointer latch.

12. The sequential fuse latch device of claim 1, wherein the pointer latches propagate a value of an initialized pointer latch through the shift register in response to a clock signal.

13. A sequential fuse latch device comprising:
    an array of fuse latches, wherein each fuse latch is a data storage element; and
    a shift register comprising a plurality of operation inputs to the array of fuse latches, wherein the shift register controls a sequential operation of the array of fuse latches, and wherein the operation is a precharge operation of a first fuse latch and a read operation of a second fuse latch.

14. The sequential fuse latch device of claim 13, wherein the operation is a read operation of the fuse latches.

15. The sequential fuse latch device of claim 13, wherein the operation is a precharge operation of the fuse latches.

16. The sequential fuse latch device of claim 13, wherein each fuse latch device comprises:
    a first transistor connected to a precharge signal and a power supply;
    a latch connected to a data signal, comprising a second transistor and connected to the first transistor, wherein the first and second transistors precharge the latch; and
    a third transistor connecting the data signal to a fuse, wherein a read signal and a fuse power up signal control the third transistor and a read operation of the fuse.

17. The device of claim 16, further comprising a fourth transistor connecting the data signal to a power supply.

18. The sequential fuse latch device of claim 16, further comprising:
    a plurality of transfer gates connected to the data signal, wherein each transfer gate is connected to a clock signal; and
    a second latch, wherein an adjacent sequential fuse latch device is connected to a data shift output of the second latch.

19. A method for sequential fuse operation comprising the steps of:
    initializing a first pointer latch to a first voltage;
    initializing a plurality of second pointer latches to a second voltage;
    precharging a plurality of fuse latches connected to the plurality of second pointer latches;
    propagating an initial value of the first pointer latch through each of the plurality of second pointer latches; and
    activating an operation of each fuse latch as the initial value is propagated,
    whereby each fuse latch receives a separate precharge input signal, which controls a precharge operation, and a read input signal, which controls a read operation, and
    whereby the precharge input signal and the read input signal are generated by a corresponding pointer latch and control less than the plurality of fuse latches.

20. A sequential fuse latch device comprising:
    a plurality of fuse latches, each fuse latch comprising a data storage element and a fusible link; and
    a shift register comprising a plurality of pointer latches, wherein each pointer latch is connected to at least one fuse latch, wherein the shift register controls a sequential operation of the plurality of fuse latches,
    wherein each fuse latch is connected to two corresponding pointer latches, wherein each pointer latch comprises a precharge control signal connected to a first fuse latch and a read operation control signal connected to a second fuse latch.

21. The sequential fuse latch device of claim 20, wherein the operation is a read operation of the fuse latches.

22. The sequential fuse latch device of claim 20, wherein the operation is a precharge operation of the fuse latches.

23. The sequential fuse latch device of claim 20, wherein the operation is a precharge operation of a first fuse latch and a read operation of a second fuse latch.

24. The sequential fuse latch device of claim 20, wherein each pointer latch comprises an initialization circuit.

25. The sequential fuse latch device of claim 24, wherein the initialization circuit presets a state of the pointer latch.

26. The sequential fuse latch device of claim 20, wherein each pointer latch controls one of a fuse read operation, a fuse latch precharge operation, and a fuse read operation and a fuse latch precharge operation.

27. The sequential fuse latch device of claim 20, wherein a fuse corresponding to a fuse latch is programmable, and wherein each pointer latch controls a programming operation according to an evaluation of the fuse latch.

28. The sequential fuse latch device of claim 20, further comprising an initialization signal connection to each pointer latch.

29. The sequential fuse latch device of claim 20, further comprising:
    a common power supply connected to each fuse;
    a clock signal connected to each pointer latch; and
    a shift signals connected in series between each pointer latch.

30. The sequential fuse latch device of claim 20, wherein the pointer latches propagate a value of an initialized pointer latch through the shift register in response to a clock signal.

31. A sequential fuse latch device comprising:
    an array of fuse latches,
    wherein each fuse latch is a data storage element, and wherein each fuse latch
    device comprises
    a first transistor connected to a precharge signal and a power supply,
    a latch connected to a data signal, comprising a second transistor and connected to the first transistor, wherein the first and second transistors precharge the latch, and
    a third transistor connecting the data signal to a fuse, wherein a read signal and a fuse power up signal control the third transistor and a read operation of the fuse; and
    a shift register comprising a plurality of operation inputs to the array of fuse latches, wherein the shift register controls a sequential operation of the array of fuse latches.

32. The sequential fuse latch device of claim 30, wherein the operation is a read operation of the fuse latches.

33. The sequential fuse latch device of claim 30, wherein the operation is a precharge operation of the fuse latches.

34. The sequential fuse latch device of claim 30, wherein the operation is a precharge operation of a first fuse latch and a read operation of a second fuse latch.

35. The device of claim 30, further comprising a fourth transistor connecting the data signal to a power supply.

36. The sequential fuse latch device of claim 30, further comprising:
    a plurality of transfer gates connected to the data signal, wherein each transfer gate is connected to a clock signal; and
    a second latch, wherein an adjacent sequential fuse latch device is connected to a data shift output of the second latch.

* * * * *